(12) United States Patent
Schröder et al.

(10) Patent No.: US 7,348,279 B2
(45) Date of Patent: Mar. 25, 2008

(54) METHOD OF MAKING AN INTEGRATED CIRCUIT, INCLUDING FORMING A CONTACT

(75) Inventors: Uwe Paul Schröder, Lake Carmel, NY (US); Jochen Schacht, Hsinchu (TW)

(73) Assignee: Infineon Technologies AG, Munich (DE)

( * ) Notice: Subject to any disclaimer, the term of this patent is extended or adjusted under 35 U.S.C. 154(b) by 72 days.

(21) Appl. No.: 11/273,261

(22) Filed: Nov. 15, 2005

(65) Prior Publication Data
US 2006/0110903 A1    May 25, 2006

(30) Foreign Application Priority Data
Nov. 16, 2004 (DE) .................. 10 2004 055 248

(51) Int. Cl.
*H01L 21/302* (2006.01)
(52) U.S. Cl. .................. 438/717; 438/620; 438/720
(58) Field of Classification Search ............... 438/706, 438/710, 714, 717, 720, 620, 629
See application file for complete search history.

(56) References Cited

U.S. PATENT DOCUMENTS 4,837,176 A * 6/1989 Zdebel et al. ............... 438/552
6,326,300 B1   12/2001 Liu et al.

FOREIGN PATENT DOCUMENTS

DE   101 64 306 A1   7/2003
DE   103 41 321 A1   4/2005

OTHER PUBLICATIONS

Jun. 23, 2005 German Examination Report.

* cited by examiner

*Primary Examiner*—Lan Vinh
(74) *Attorney, Agent, or Firm*—Dicke Billig & Czaja, PLLC

(57) ABSTRACT

In order to form a contact in a layer on a substrate, in particular a contact in a logic circuit in a semiconductor component, the mask layer is structured for etching of the contact holes with a photoresist layer which is exposed using two masks, with the first mask containing a regular pattern of contact structures with a period which corresponds to the order of magnitude of twice the edge length of the contact hole, and with the second mask containing a pattern with a structure which surrounds at least the contact hole area, and thus covers it.

25 Claims, 6 Drawing Sheets

METHOD OF MAKING AN INTEGRATED CIRCUIT, INCLUDING FORMING A CONTACT

CLAIM FOR PRIORITY

This application claims the benefit of priority to German Application No. 10 2004 055 248.7 filed in the German language on Nov. 16, 2004, the contents of which are hereby incorporated by reference.

TECHNICAL FIELD OF THE INVENTION

The invention relates to a method for formation of a contact in a layer on a substrate and, in particular, a contact in a logic circuit in a semiconductor component.

BACKGROUND OF THE INVENTION

In integrated semiconductor circuits, a conductive connection is produced by means of contacts between the active components and the interconnects which are located in different structure levels. Integrated semiconductor circuits are in this case generally produced by means of a planar technique. This includes a sequence of individual processes which each act over the entire area of the surface of the semiconductor wafer and, by means of suitable masking layers, lead deliberately to local changes in the semiconductor material.

In this case, the semiconductor wafers are virtually always structured using lithography. The major feature of this technique is a radiation-sensitive photoresist, which is applied to the semiconductor wafer and is irradiated in the desired areas, such that only the irradiated or unirradiated areas are removed in a suitable developer. The photoresist pattern that is produced in this way is then used as a mask for a subsequent process step, for example contact hole etching. The photoresist mask is then dissolved once again.

The major driver for the development of integrated semiconductor circuits is the continuous miniaturization of the components, and thus also of the contact structures. The minimal extent of the contacts is in this case of critical importance to the efficiency with which the area of an integrated semiconductor circuit is used. The smaller the minimum separation between the individual contacts, the better can the available area on the semiconductor wafer be used. In order to make it possible to produce ever smaller structures and, in particular, contacts as well in the course of the progress of miniaturization, the planar technique offers the capability to change to shorter exposure wavelengths in the lithography process for exposure of the mask, in order to transfer the desired structures to the photoresist that has been applied to the semiconductor wafer. However, for financial reasons, it is at the same time desirable to continue to use the lithography equipment which exists at the moment for as long as possible, before the next shorter wavelength is used in order to achieve further structural size reductions.

In order to achieve reductions in structural size even with the present exposure wavelength, so-called resolution enhancement techniques (RET) are therefore increasingly being used for exposure. Off-axis illumination is particularly suitable for the formation of very small contact structures. In the case of off-axis illumination, the light source of the optical exposure device is not imaged centrally on the object opening, but obliquely, for example in an annular shape, by means of a fly's-eye lens or by means of a quadrupole lens. This off-axis illumination results in higher diffraction orders entering the objective openings, thus increasing the resolution.

During the production of integrated semiconductor circuits, in particular memory circuits, RET methods can in general be used to improve the resolution of contact structures only in the cell array area in which the contact structures have a regular pattern so that, for example, diffraction orders which improve the resolution are achieved by means of the off-axis illumination. However, in the logic area, the contact structures are generally not arranged regularly but have a high degree of complexity, on the one hand with contacts some of which are isolated from one another, and on the other hand with densely packed contacts. Since, in general, no RET methods can be used to form a structure of a reduced size in the logic area for this reason, semiconductor memory circuits generally need to have a greater separation between the contacts in the logic area than in the active area, thus leading to a deterioration in the utilization of the area.

SUMMARY OF THE INVENTION

The present invention provides a method for formation of a contact in an integrated circuit, in particular a contact in the logic area of a semiconductor memory, by means of which even quasi-randomly arranged contacts without any regular superstructure can be imaged using RET techniques, thus making it possible to achieve the smallest possible shrink factor for a predetermined exposure wavelength, in the logic area as well.

In one embodiment according to the invention, there is formation of a contact in a layer on a substrate, in particular a contact in a logic circuit in a semiconductor component, the mask layer is structured, for etching of the contact holes, using a photoresist layer which is exposed using two masks. In this case, the first mask has a regular pattern of contact structures with a period which corresponds to the order of magnitude of twice the edge length of the contact hole, and the second mask has a pattern with a structure which surrounds at least the contact hole area and covers this area.

After exposure with the two masks, the photoresist layer is then developed in order to form a photoresist block, which covers the contact hole area, on the mask. The mask layer is then treated in the area around the photoresist block on the mask layer, by means of the photoresist block, in order to change the mask layer in this area. After removal of the photo block, the mask layer is then selectively etched in the area of the contact hole, in order to expose the substrate layer surface. The substrate layer can then be etched using the structured mask layer and, after removal of the mask layer, the contact hole can be applied, with the contact layer material, in order to produce the desired contact.

In another embodiment of the invention, there is a process for carrying out the photolithography between photoresist structuring with two separate masks allowing the first mask to be formed with a regular arrangement of contact structures with a minimal period in order to make it possible to use RET methods, in particular off-axis illumination, for exposure purposes, and thus to produce contact holes with the maximum shrink factor at a predetermined exposure wavelength. The second mask, whose pattern includes a structure which covers the desired contact hole, can then be used to expose the contact structures which are not required and were imaged by the first mask in the photoresist layer, thus removing them.

This procedure allows contacts which are arranged quasi-randomly in the photoresist layer and do not have a regular superstructure to be defined with as small a resolution as possible. A mask layer located underneath this can then be exposed using the photoresist mask in such a way that the mask layer area located under the photoresist mask is open in a subsequent etching step after removal of the photoresist mask, this achieving tone reversal. The layer on the semiconductor wafer in which the contact is intended to be produced can then in turn be etched free using this structured hard mask and, after removal of the hard mask, can be filled with contact layer material in order to form the contact in this way.

According to one preferred embodiment, the pattern on the first mask comprises at least nine contact structures with the contact hole to be formed as the central structure, and the pattern on the second mask comprises a structure by means of which the contact hole structures of the first mask are exposed, with the exception of the central contact structure. This procedure ensures that the pattern on the first mask is formed with a high degree of regularity, with the contact hole to be formed being surrounded by additional contact structures that are the same distance apart. A mask such as this allows very small contact structure dimensions to be imaged when using RET methods. The second mask is then used to cover the contact hole to be formed and, at the same time, to expose those contact structures in the first mask which are to be exposed for removal. The pattern of the second mask may in this case be larger than the effective area of the contact hole to be formed, since this is in fact imaged accurately by the first mask itself, so that the production of this second mask remains non-critical. According to the invention, minimal isolated contacts can in this way also be formed in the logic area of the semiconductor memory, in order to achieve maximum area efficiency.

According to another preferred embodiment, when the contacts are densely packed but are arranged irregularly, the masks are designed such that the pattern on the first mask comprises regularly arranged contact structures including the contact holes to be formed with further contact structures, and the pattern on the second mask comprises a structure by means of which the contact structures of the first mask are exposed, with the exception of the structures with the contact holes to be formed. This embodiment allows even densely packed quasi-randomly arranged contacts, such as those which occur in particular in the logic area of semiconductor memories, to be imaged with minimal resolution using RET techniques.

In order to achieve effective tone reversal, that is to say for inverse formation of the hard mask with respect to the photoresist block which remains after development of the photoresist layer, a dopant is introduced into the mask layer with the photoresist block as a cover so that, after removal of the photoresist block, the undoped area of the mask layer can be selectively etched with respect to the doped area, thus allowing production of a hole structure in the mask. In this case, an amorphous polysilicon layer can preferably be used as the mask layer and a p-dopant, preferably boron or boron fluoride, can be used as the dopant. The undoped amorphous polysilicon layer areas are then selectively etched, preferably using an alkaline medium.

If an amorphous polysilicon layer is used as the mask layer, an n-dopant may, however, also be used as the dopant, with the mask layer being oxidized after the removal of the photoresist block, an oxide etching then being used as the selective etching process. The above method allows the photoresist block which is formed in the photoresist layer to be transferred with high precision to the mask layer located underneath it, with a corresponding contact hole being opened.

BRIEF DESCRIPTION OF THE DRAWINGS

The invention will be explained in more detail with reference to the exemplary embodiments and attached drawings, in which.

DETAILED DESCRIPTION OF THE INVENTION

Figure 1A:
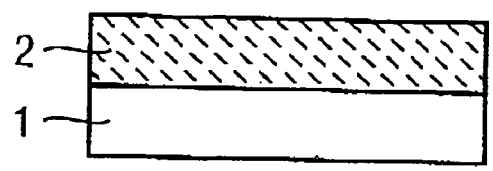
FIG. 1 shows a process sequence according to the invention for formation of a contact in a layer on a substrate.
Figure 1B:
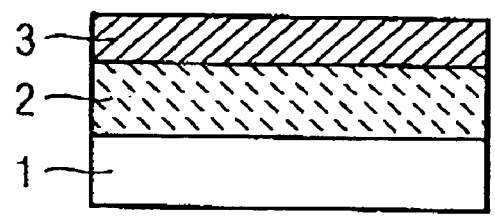

The invention will be described using the example of the formation of contacts in the logic area of a semiconductor memory. The method according to the invention for formation of contacts may, however, be carried out in any desired layers on a substrate and is particularly advantageous when the contacts are distributed quasi-randomly, without any regular structure, in the layer. The contacts are in this case produced by means of the planar technique, in which local changes can be implemented deliberately in a layer material, by means of suitable masking layers.

The formation of contacts provides minimal structure dimensions and to make it possible to form contacts at a minimal distance from one another, in order to make it possible to achieve a better area efficiency and thus a higher component density as well. One limiting factor for the resolution performance is in this case the lithography technique which is used to structure the layers in the course of the planar technique.

In lithography, a radiation-sensitive photoresist is applied to the layer to be structured and is irradiated in the desired areas such that the irradiated or unirradiated areas are removed in a suitable developer. The photoresist pattern produced in this way can then be used as a mask for processing of the layer located underneath it, for example for etching or for ion implantation.

The size of the structures formed in the photoresist, and thus the minimum extent of the structures formed using the photoresist layer are governed essentially by the exposure method and in this case by the exposure wavelength. Using the exposure method is, for financial reasons, in this case to use a predetermined exposure wavelength which is as long as possible, and at the same time to reduce the structure sizes.

One method for forming smaller structures at a predetermined exposure wavelength is to use so-called resolution enhancement techniques (RET) and, in the process and in particular, off-axis illumination. In off-axis illumination, the light source is imaged obliquely onto the objective opening, so that higher diffraction orders also enter the objective opening, thus leading to improved resolution. When using RET methods such as these, in particular the off-axis illumination method, it is, however, necessary for the structures to be imaged to be arranged regularly. In many large-scale-integrated semiconductor circuits, particularly logic circuits in the periphery of semiconductor memories, the contact holes for making contact with the components are, however, distributed without any regular superstructure quasi-randomly over the semiconductor wafer.

In order to make it possible to use RET methods, in particular off-axis illumination, for the formation of irregularly arranged, isolated or densely packed contacts, such as those which occur in particular in the case of a logic circuit, as well, the photoresist layer according to the invention which includes the contact structure in the design level for subsequent transfer to the semiconductor layer structure is exposed using two masks, with the first mask having a regular pattern of contact structures with a period which corresponds to twice the edge length of the desired contact. When the photoresist is exposed using this mask, it is then possible to use RET methods, particularly off-axis illumination, for the exposure process. However, the photoresist layer is then exposed once again in order to expose the unrequired contact structures such that they are removed using a second mask which covers the desired contact or the desired contact arrangement during the exposure process, exposing the unrequited contact structures which are produced during the first exposure process.

This procedure allows both densely arranged and isolated resist structures to be produced in the resist layer with a maximum shrink factor using a predetermined exposure length. The resist mask is then preferably used to structure the layer located underneath as a hard mask, with a tone reversal being produced, that is to say those areas which were originally covered by the photoresist structure being etched free in the hard mask. The semiconductor layer structure can then be structured using this hard mask in order to form the contacts.

FIG. 1 shows, schematically, a process sequence according to the invention, with the starting point, as illustrated in FIG. 1a, being a structured semiconductor wafer 1 with a layer 2 in which the contact is intended to be formed. The pre-structured semiconductor wafer 1 may in this case be a silicon wafer, and the layer in which the contact is intended to be formed may be an isolator layer such as silicon dioxide. A hard mask layer 3 is then deposited over a large area on this substrate layer 2. Amorphous polysilicon is in this case preferably used as the hard mask layer 3, which can be deposited on the substrate layer 2 using all known deposition methods. FIG. 1b shows a cross section through the semiconductor wafer after this process step.

Figure 1C:
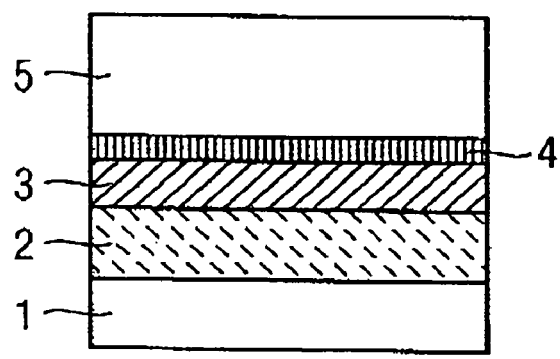

An antireflective layer 4 is then preferably applied using a spin-deposition process, after which a light-sensitive photoresist layer 5 is applied to hard mask layer 3. The antireflective layer 4 may in this case be used as an adhesion promoter and can improve the exposure by reducing undesirable interference effects. FIG. 1c shows a cross section through the semiconductor wafer after the application of the photoresist layer 5.

Figure 1D:
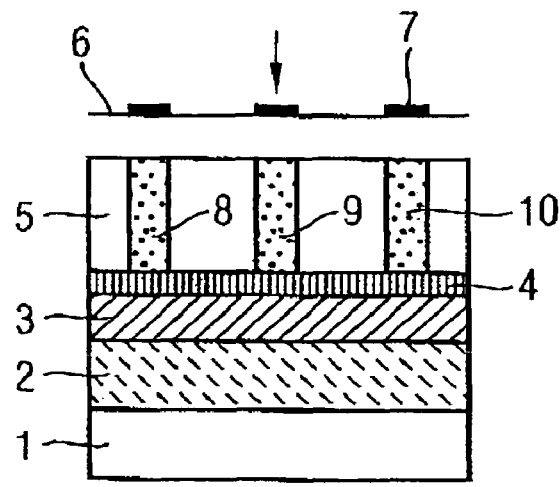
Figure 1E:
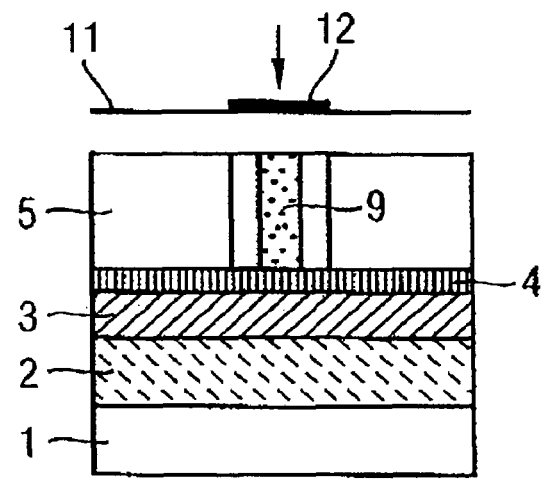

The photoresist layer 5 is then exposed using a first mask 6, as is shown in FIG. 1d, which has a regular pattern of contact structures 7 with a period which corresponds to twice the edge length of the desired contact hole. During the exposure process, it is in this case possible to additionally use RET techniques such as off-axis illumination in order to improve the resolution, because of the regular arrangement.

After this first exposure, during which, as is shown in FIG. 3d, the first mask 6 is used to transfer three regularly arranged contact structures 8, 9, 10 by exposure to the photoresist layer, the contact structures which are not required, in the illustrated embodiment the two contact structures 8, 10 at the side, are then exposed in order to remove them, by means of a second mask 11. The pattern 12 of this second trimming mask 11 is in this case designed such that it protects the contact structure in the photoresist layer, on which the contact is then intended to be formed, preferably over a large area before exposure while the two side contact structures which are not required in contrast remain free. The second trimming mask 11, for which the structure size of the pattern is not critical, since all that is necessary in this case is to ensure that the area which is not exposed by the first mask 6 and corresponds to the contact structure to be formed is protected against exposure, and can be produced at low cost.

Figure 1F:
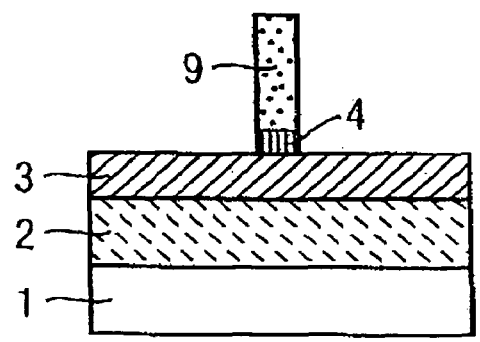

After this second exposure, the photoresist layer is then developed in a conventional manner, as is shown in FIG. 1f, with the exposed area being removed while, in contrast, the unexposed area of the contact structure remains.

The photoresist mask, comprising the photoresist block 9, is then in turn used for processing the hard mask layer 3 located underneath it, in order to form the hard mask with a tone reversal with respect to the remaining photoresist block. This is in this case preferably carried out in such a way that, if the hard mask layer 3 is an amorphous polysilicon layer, it is implanted with a dopant. In this case, a p-dopant such as boron or boron fluoride may be used as the dopant.

Figure 1G:
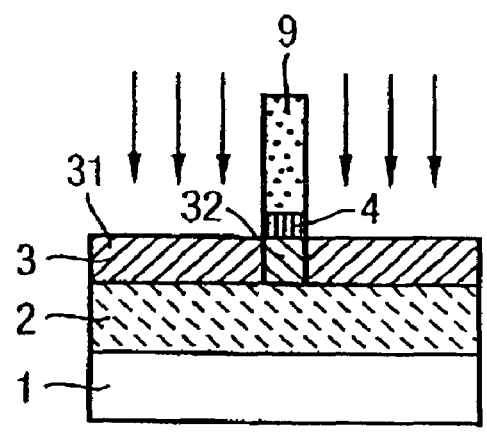
Figure 1H:
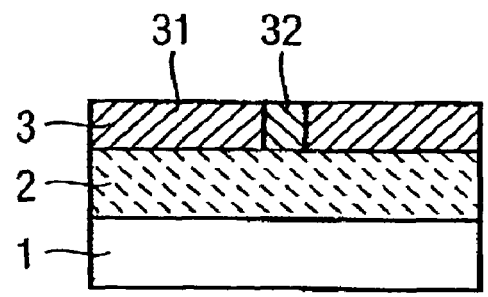
Figure 1I:
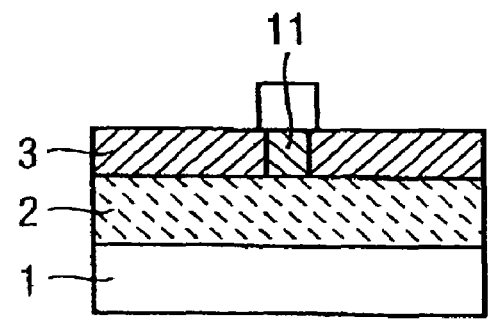

After the dopant implantation, as is shown in FIG. 1g, the remaining photoresist block 9 is then removed, for example by means of plasma combustion, and the undoped amorphous polysilicon 31 which is exposed after the removal of the photoresist block is etched selectively with respect to the doped amorphous polysilicon 32, in order to open the mask layer in the area of the desired contact. FIG. 1h shows a cross section through the semiconductor wafer after the removal of the photoresist block, and FIG. 1i shows this after the tone reversal with the contact hole area 11 opened in the polysilicon hard mask 3 after the selective etching of the undoped polysilicon area 32. The polysilicon etching is in this case preferably carried out using an alkaline medium, for example $NH_4OH$.

As an alternative to the p-doping in the method shown in FIG. 1g, it is also possible to carry out n-dopant implantation into the amorphous polysilicon layer, using the photoresist block as a mask. The rest of the process sequence is then preferably to remove the photoresist block, as is shown in FIG. 1h, after the dopant implantation, and then to oxidize the polysilicon layer 3, at least in the surface area, but preferably in the entire layer. The selective etching is then carried out as oxide etching, in which the undoped oxide is removed in order to form in the hard mask layer 3 with a contact hole area 11.

Figure 1J:
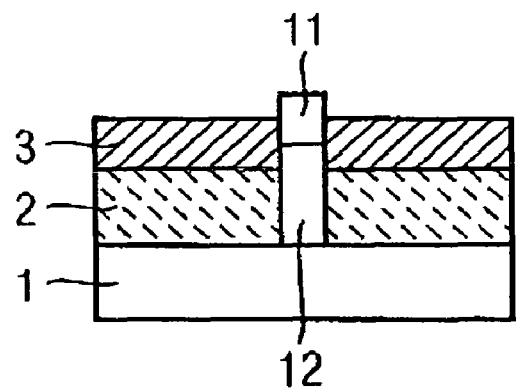
Figure 1K:
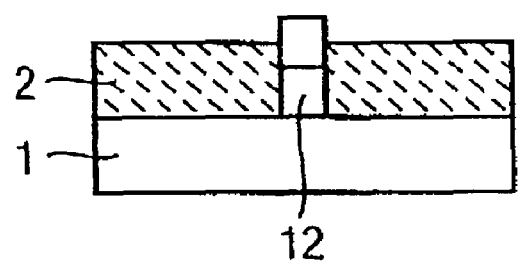
Figure 1L:
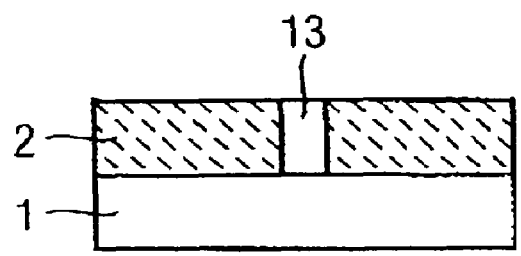

A contact hole 12 is then structured in the substrate layer 3 using a suitable etching process, for example plasma dry etching, by means of the structured hard mask 3 that is shown in FIG. 1i. FIG. 1j shows a cross section through the semiconductor wafer after this process step. After the structuring of the substrate layer 2, the hard mask 3 is then removed by means of a suitable method (see FIG. 1k), and the contact hole 12 is cleaned. The contact hole 12 is then filled with the contact material, as is illustrated in FIG. 1l. The contact hole filling 13 may in this case be carried out by means of a deposition and back-etching process, in order to achieve a planar surface.

Figure 2:
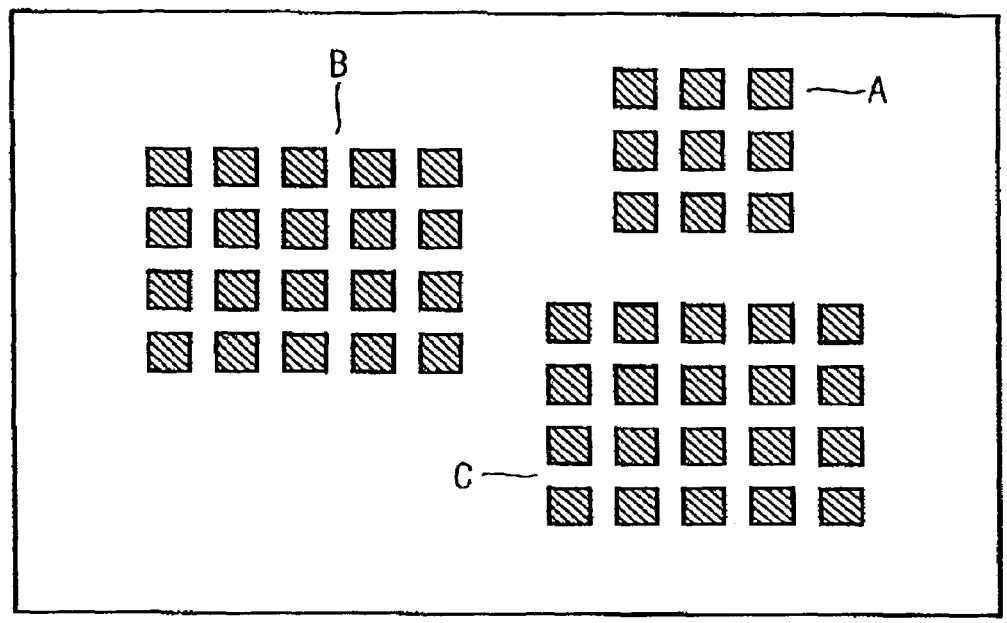
FIG. 2 shows a plan view of an exemplary contact hole pattern for the first mask that is used for photoexposure.
Figure 3:
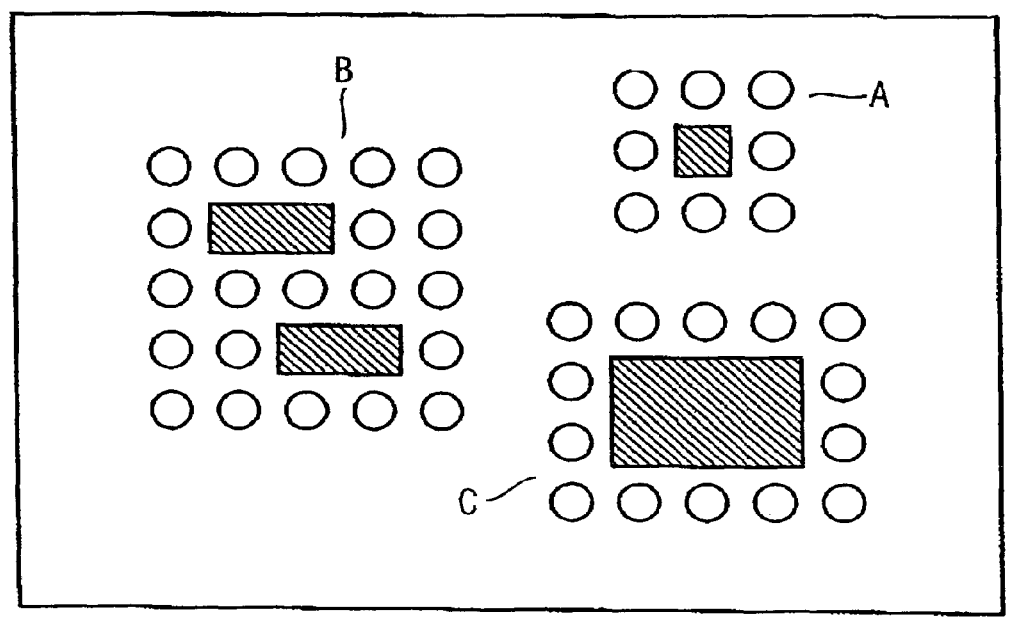
FIG. 3 shows a plan view of an exemplary mask layout for the second mask which is used for photoresist exposure.
Figure 4:
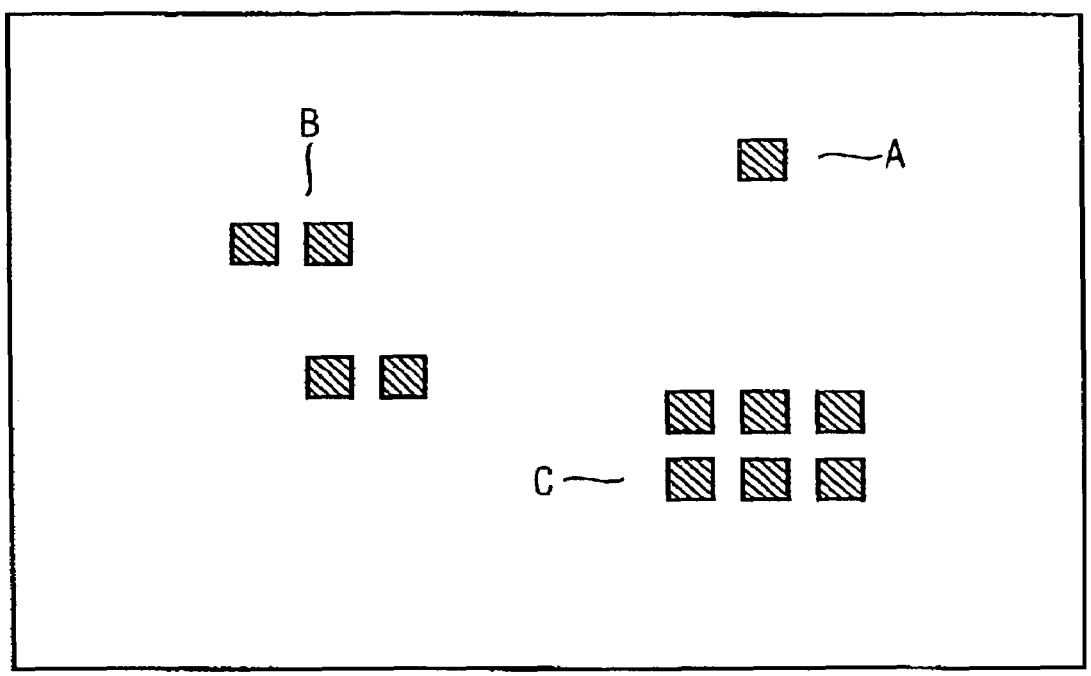
FIG. 4 shows a plan view of the photoresist layer after development, with the photoresist layer having been exposed using the masks shown in FIGS. 2 and 3.

FIG. 2 shows a layout of a first mask, and FIG. 3 shows a layout of a second mask, in order to form isolated and dense contact structures, as are illustrated in FIG. 4. Photolithographic masks are generally transparent mounts which have a pattern of a design level as a chromium layer.

The chromium layer is light-absorbent, so that those areas of the photoresist which are covered by the chromium layer are not exposed during an exposure process, so that the mask structure is imaged on the photoresist. As an alternative to chromium, it is possible to use a semi-absorbent, phase-shifting material, such as molybdenum silicide. FIG. 2 shows a plan view of a detail of a first mask, which is suitable for use of RET exposure methods, with three mask areas A, B, C, which each have a regular arrangement of contact structures. In this case, the area A includes a 3×3 matrix with nine contact structures. The areas B, C each have a 4×5 matrix with 20 contact structures. The period between the individual contact structures in this case corresponds to twice the edge length of the contact structure.

FIG. 3 shows a second mask, by means of which the contact structures which are not required in the photoresist are exposed such that they are removed at those points where no contact holes are intended to be formed later in the semiconductor layer. The contact structures which are not desired in the first mask are in this case indicated as circles with the second mask. The chromium layer in the area A of the second mask is designed such that only the central contact block is protected during the second exposure. In the area 2, 2×2 contact structures with a chromium structure are, in contrast, protected during the second exposure. The area C protects the central six contact structures during the second exposure.

The chromium spots in the second mask for protection of the unexposed contact structures in the first mask are in this case designed such that they cover at least the contact structures which are intended to be protected, but are at most so large that the contact structures which are intended to be exposed to remove them in the first mask remain free. The dimensions of the chromium areas of the second mask are therefore not critical, so that the mask can be produced at low cost.

FIG. 4 shows a detail of a photoresist layer, with contact structures which are not exposed after double exposure by the first and second mask and can then be converted to contacts in the substrate layer, using the process sequence shown in FIG. 1.

The invention thus makes it possible to form even irregular contact structures with a maximum shrink factor by the use of RET methods during exposure, by double exposure using a first mask which has a regular pattern, and a second mask in which the undesired areas are exposed such that they are removed.

What is claimed is:

1. A method for manufacturing an integrated circut, comprising:
    forming a mask layer over a substrate layer;
    forming a resist layer over the mask layer;
    exposing the resist layer using a first mask which has a regular pattern of contact structures with a period that corresponds to the order of magnitude of twice the edge lengths of the contact hole;
    exposing the resist layer using a second mask, which has a pattern at least;
    developing the resist layer to form a block the mask layer;
    treating the mask layer in the area around the resist block to change portions of the mask layer in the area around the resist block;
    removing the resist block from the mask layer;
    etching the mask layer in the area of the contact hole, in order to expose the substrate layer surface;
    etching the substrate layer with the aid of the mask layer in the area of the contact hole, in order to expose the substrate surface;
    removing the mask layer;
    etching the changed portions of the mask layer; and
    removing the uncoverd portions of the substrate layer.

2. The method as claimed in claim 1, wherein the pattern on the first mask comprises at least nine contact structures with the contact hole to be formed as the central structure, and the pattern on the second mask comprises a structure by means of which the contact structures of the first mask are exposed, with the exception of the central contact structure.

3. The method as claimed in claim 1, wherein a plurality of contacts are formed, wherein the pattern on the first mask comprises regularly arranged contact structures including the contact holes to be formed with further contact structures, and wherein the pattern on the second mask comprises a structure by means of which the contact structures of the first mask are exposed, with the exception of the structures with the contact holes to be formed.

4. A method for manufacturing an integrated circuit, comprising;
    forming a mask layer over a substrate layer;
    forming a resist layer over the mask layer;
    exposing the resist layer using a first mask which has a regular pattern of contact structures with a period that corresponds to the order of magnitude of twice the edge lengths of the contact hole;
    exposing the resist layer using a second mask, which has a pattern at least;
    developing the resist layer to form a resist block the mask layer;
    treating the mask layer in the area around the resist block to change portions of the mask layer in the area around the resist block;
    removing the resist block from the mask layer;
    etching the mask layer in the area of the contact hole, in order to expose the substrate layer surface;
    etching the substrate layer with the aid of the mask layer in the area of the contact hole, in order to expose the substrate surface;
    removing the mask layer;
    etching the changed portions of the mask layer; and
    removing the uncoverd portions of the substrate layer, and wherein the treatment of the mask layer comprises the introduction of a dopant.

5. The method as claimed in claim 4, wherein the contact hole is formed in the substrate layer by using a plasma dry etching process.

6. The method as claimed in claim 4, wherein an antireflective layer is provided between the mask layer and the photoresist layer.

7. The method as claimed in claim 4, wherein the mask layer is an amorphous polysilicon layer, and the dopant is a p-dopant.

8. The method as claimed in claim 7, wherein the p-doped amorphous polysilicon layer is etched selectively using an alkaline medium.

9. The method as claimed in claim 4, wherein the mask layer is an amorphous polysilicon layer, and the dopant is an n-dopant.

10. The method as claimed in claim 9, wherein at least the surface of the n-doped amorphous polysilicon layer is oxidized before selective etching, and the etching is oxide etching.

11. A method for manufacturing an integrated circuit, comprising:

forming a mask layer over a substrate layer;
forming a resist layer over the mask layer;
exposing the resist layer using a first mask to form non-exposed portions;
exposing the resist layer using a second mask, which has a pattern so that at least one of the non-exposed portions is not exposed;
developing the resist layer to form a resist block over the mask layer;
treating the mask layer in the area around the resist block to change portions of the mask layer in the area around the resist block;
etching the changed portions of the mask layer; and
removing the uncovered portions of the substrate layer.

12. The method as claimed in claim 11, wherein the pattern on the first mask comprises at least nine contact structures with the contact hole to be formed as the central structure, and the pattern on the second mask comprises a structure by means of which the contact structures of the first mask are exposed, with the exception of the central contact structure.

13. The method as claimed in claim 11, wherein a plurality of contacts are formed, wherein the pattern on the first mask comprises regularly arranged contact structures including the contact holes to be formed with further contact structures, and wherein the pattern on the second mask comprises a structure by means of which the contact structures of the first mask are exposed, with the exception of the structures with the contact holes to be formed.

14. The method as claimed in claim 11, comprising forming the contact hole is the substrate layer using a plasma dry etching process.

15. The method as claimed in claim 11, comprising providing an antireflective layer between the mask layer and the photoresist layer.

16. The method as claimed in claim 11, wherein the first mask has a regular pattern of contact structures with a period that corresponds to the order of magnitude of twice the edge lengths of the contact hole.

17. The method of claim 11, wherein the second mask comprises a pattern with a structure which surrounds at least the contact hole area.

18. The method of claim 11, comprising removing the resist block before the etching of the changed portions of the mask layer.

19. The method of claim 11, comprising removing the uncovered portions of the substrate layer by etching.

20. The method of claim 11, comprising:
removing the mask layer after the removing of the uncovered portions of the substrate layer; and
filling the removed portions of the substrate layer with a contact layer material.

21. The method as claimed in claim 11, wherein the treatment of the mask layer comprises the introduction of a dopant.

22. The method as claimed in claim 21, wherein the mask layer is an amorphous polysilicon layer, and the dopant is a p-dopant.

23. The method as claimed in claim 22, wherein the p-doped amorphous polysilicon layer is etched selectively using an alkaline medium.

24. The method as claimed in claim 21, wherein the mask layer is an amorphous polysilicon layer, and the dopant is an n-dopant.

25. The method as claimed in claim 24, wherein at least the surface of the n-doped amorphous polysilicon layer is oxidized before selective etching, and the etching is oxide etching.

* * * * *